US005882487A

United States Patent [19]
Li et al.

[11] Patent Number: 5,882,487
[45] Date of Patent: *Mar. 16, 1999

[54] REMOVING CONTAMINATION

[75] Inventors: Lin Li; Julian Timothy Spencer, both of Liverpool, England

[73] Assignee: British Nuclear Fuels, Plc., Cheshire, Great Britain

[ * ] Notice: This patent issued on a continued prosecution application filed under 37 CFR 1.53(d), and is subject to the twenty year patent term provisions of 35 U.S.C. 154(a)(2).

[21] Appl. No.: 765,039

[22] PCT Filed: Jun. 15, 1995

[86] PCT No.: PCT/GB95/01393

§ 371 Date: Mar. 20, 1997

§ 102(e) Date: Mar. 20, 1997

[87] PCT Pub. No.: WO95/35575

PCT Pub. Date: Dec. 28, 1995

[30] Foreign Application Priority Data

Jun. 17, 1994 [GB] United Kingdom ................... 9412238

[51] Int. Cl.[6] ........................... H01L 21/268; C25D 5/34; B05D 3/06

[52] U.S. Cl. ............................... 204/157.41; 204/157.61; 204/158.2; 588/210; 588/212; 588/219; 588/227; 134/1

[58] Field of Search ......................... 204/157.15, 157.41, 204/157.61, 158.2; 588/204, 210, 212, 219, 227; 134/1

[56] References Cited

U.S. PATENT DOCUMENTS

| | | | |
|---|---|---|---|
| 3,941,670 | 3/1976 | Pratt, Jr. | 204/157.61 |
| 4,898,650 | 2/1990 | Wu et al. | 204/157.15 |
| 5,024,968 | 6/1991 | Engelsberg | 437/173 |
| 5,151,134 | 9/1992 | Boquillon et al. | 134/1 |

OTHER PUBLICATIONS

Brochure entitled "Laser Technology," Urenco Deutschland GmbH, as early as 1994 (no month available).

*Primary Examiner*—Arun S. Phasge
*Attorney, Agent, or Firm*—Workman, Nydegger, & Seeley

[57] ABSTRACT

A method of removing from the surface of an object a contaminating substance buried in an organic substance on the surface of the object, the method including directing a laser beam at the organic substance to cause chemical change of the organic material or direct removal of the organic material by laser generated chemical change.

25 Claims, 1 Drawing Sheet

REMOVING CONTAMINATION

This application is a 371 of PCT/GB95/01393 filed Jun. 15, 1995.

The present invention relates to removing contaminating substances from surfaces such as those of buildings, structure, industrial plants, vessels, cabins and the like.

According to the present invention there is provided a method of removing from the surface of an object a contaminating substance buried in an organic substance on the surface of the object which includes directing a laser beam at the organic substances to cause chemical change of the organic material or direct removal of the organic material by laser generated chemical change.

The said object may be the surface of a building, structure, industrial plant, vessel, cabin or the like.

The said contaminating substance may be a radioactive, biological or chemical contaminant.

The said organic substance in which the contamination is embedded may include one or more of paint, epoxy resin, sealant, adhesive, plastics, cloth, moss, lichen, fungus or other plants.

The said surface to be treated may be the surface of a substrate comprising a building material such as concrete, mortar, rendering, cement, brick, tiles, plaster, stainless steels, mild steels, alloying materials or the like.

The said laser beam may be of ultraviolet, visible or infrared wavelength.

The laser beam may be generated by a laser generator such as a gas laser, eg a $CO_2$ gas laser or a CO gas laser, a solid state laser, eg a Nd—YAG (Neodymium-Yttrium-Aluminium-Garnet) or a Ti-Sapphire laser, an Excimer laser, a dye laser, a free electron laser or a semiconductor laser.

The laser beam may be either pulsed or continuous.

The laser beam which preferably produces high power is used to generate photothermal energy at the surface to be treated. After absorption of such energy by the organic substance a series of chemical changes will occur to the organic substance in the following temperature ranges:

At 200°–700° C., water and hydraulic bonds in organic materials will be driven out or broken and decomposition of C—H chains will result, forming charred material—carbon.

At 700°–1000° C. carbonaceous materials will be oxidised—forming $CO_2$ and CO gases through combustion, leaving ashes of other oxides. Flames can be seen at this stage if not controlled with additional gas(es). Carbon rich contamination like soot found on the surface of most buildings in industrial cities can be removed this way.

Under these applied temperatures the substrate material (inorganic) may not be melted, or damaged but certain heat effects may be caused.

By careful control of the laser parameters this effect on the substrate can be minimised to an acceptable level.

When the laser beam has a wavelength in the ultraviolet range, direct photo-induced chemical change, such a bond breaking, may occur with organic materials, which may result in ablation.

The typical operating conditions and procedures are described below and illustrated in the embodiment described below.

The invention provides an efficient and effective method for treating contaminated surfaces, eg in the decommissioning of buildings or industrial plant facilities.

Preferably, at least one gas may be delivered to a treatment region of the surface being treated. The gas may desirably be compressed air. The gas provides removal of ashes formed by blowing them off the surface, controls any flames formed in the chemical reactions and provides oxygen to the treatment region to assist the chemical reaction occurring.

The laser beam and gas may be delivered to the treatment region via an inner nozzle or shroud and waste materials formed may be extracted by an extraction arrangement comprising an outer nozzle or shroud. The waste materials may be extracted by suction.

Conveniently the laser beam may be provided from a laser source arranged on a mobile carrying means, eg trolley, which may be transported to a site of use.

A supply of gas and a pump required for extraction of waste materials may both be carried on the said mobile carrying means, eg trolley.

The laser beam may be applied from the laser source to the region of the surface to be treated via an operator handset which may be moved by a human or robotic operator to guide the beam to the required part of the surface to be treated. The beam may be delivered from the laser source to the handset by a flexible beam delivering system, eg one or more optical fibre guides or cables, or by optical mirrors which reflect the beam or by a hollow waveguide all in a known way. The handset may include a scanning means which sweeps the laser beam over the surface to be treated with a controlled sweep speed, pattern and rate.

The laser power density of the laser beam may be between 200–250 $W/cm^2$ depending on materials to be treated, although higher power densities may be used, especially with lasers operating in the ultraviolet range. Thus focusing of laser beam may or may not be needed depending on the raw beam diameter. Paint and epoxies are easier to remove whereas wet moss is most difficult because some energy has to be used to vaporise the free water retained by the moss. Removal of contaminated organic substances on non-metallic substrates requires much less energy than on metal substrates because of higher thermal loss which occurs with the conductive metals.

The laser beam scanning speed may be between 1–1000 mm/sec depending on the materials' thickness and properties.

BRIEF DESCRIPTION OF DRAWING

An embodiment of the present invention will now be described by way of example with reference to the accompanying drawing in which.

Figure 1:
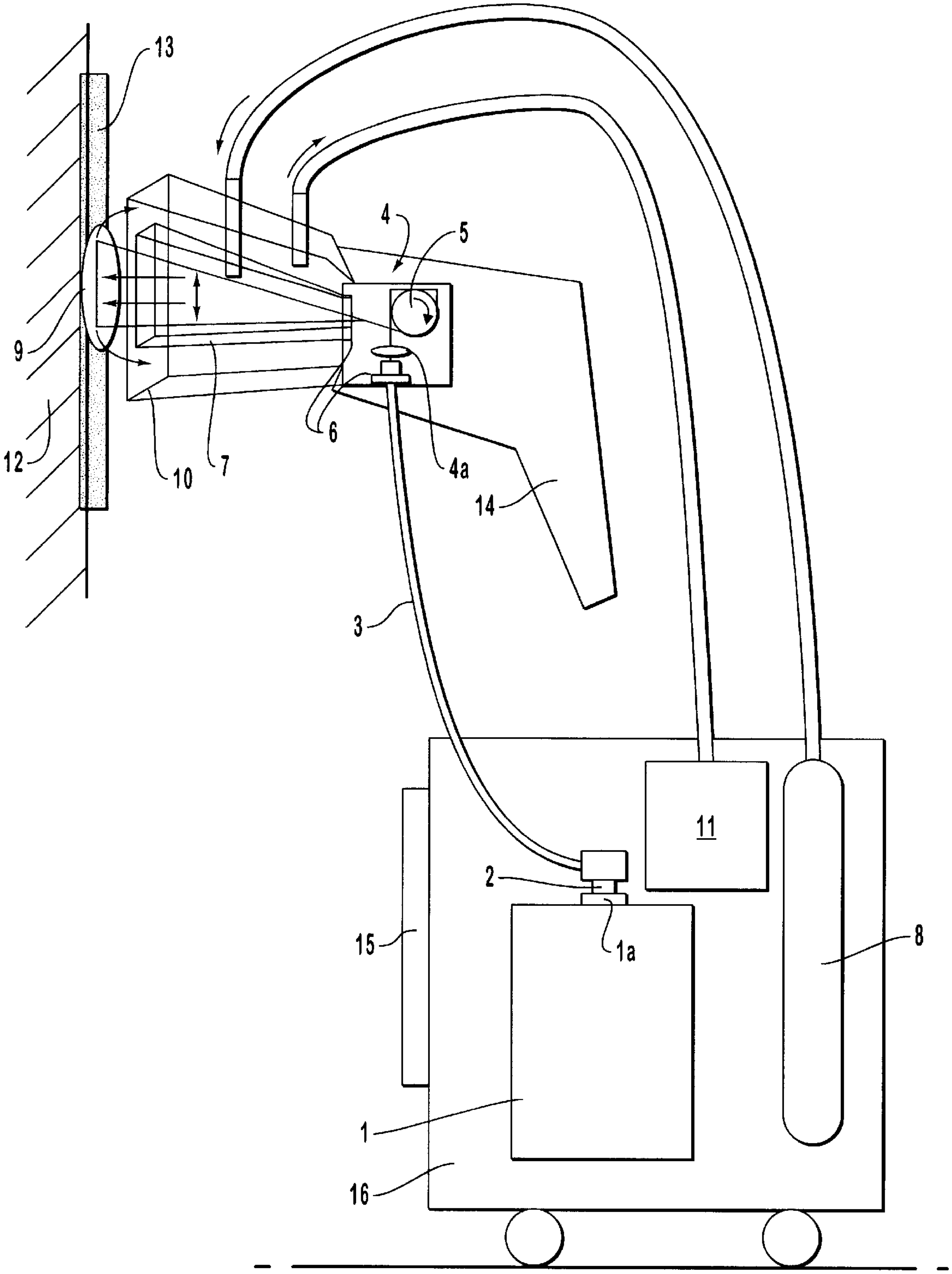
FIG. 1 is a side view of an arrangement for treating a building wall having contaminated organic material on its surface.

A laser source 1 provides a laser beam 2. The laser beam 2 exits from a laser output window la of the source 1 and is guided to an operator handset 4 by a flexible beam delivering system 3. At the handset 4 the laser beam 3 is focused by a lens 4*a* and is directed by a beam scanning means 5 onto the surface of the wall to be treated, indicated in FIG. 1 by reference numeral 12.

The scanning means 5 controls the laser beam sweep speed, pattern and rate. Windows 6 transparent to the laser beam 2 are used to isolate the laser optics from the downstream environment. An internal nozzle 7 with a suitable exit end shape such as a rectangular shape is used to pass the laser beam 2 and gas from a gas supply 8 to an interaction zone 9 on the surface 12. An external nozzle 10 with a similar end shape to the internal nozzle surrounds the internal nozzle 7. An extraction unit 11 is connected to the external nozzle 10 to collect the removed waste. An operator handle 14 is connected to the handset 4. Control switches and adjustments are mounted on an operating control box 15 located near the operator on a trolley 16. The laser generator 1 and waste collection unit 11 and gas supply unit 8 can be mounted on the trolley 16.

Materials removal rate for most organic materials is between 2000 and 5000 $cm^3$/kWhr. Removal depth increases with laser power density and reduces with scanning speed. The main advantage of the method according to the invention is the removal of surface and embedded contamination without generating serious damage or removal of the underlying materials, although a higher intensity of laser beam can be used, in appropriate circumstances, to further melt and glaze the underlying surface for subsequent sealing.

We claim:

1. A method of removing from a surface of an object a contaminating substance buried in an organic substance on said surface of said object, the method including the steps of:

(a) directing a laser beam at said organic substance, said laser beam causing said organic substance to chemically oxidize into a solid oxidized form on said surface of said object; and (b) removing said organic substance in said solid oxidized form and said contaminating substance from said surface of said object such that said organic substance remains in said solid oxidized form.

2. A method according to claim 1, wherein said solid oxidized form is removed by being blown off by a delivered gas.

3. A method according to claim 1, wherein said object is the surface of a building, structure, industrial plant, vessel, or cabin.

4. A method according to claim 1, wherein said contaminating substance is a radioactive, biological, or chemical contaminant.

5. A method according to claim 1, wherein said organic substance which said contaminating substance is buried includes one or more of paint, epoxy resin, sealant, adhesive, plastics, cloth, fungus, moss, lichen, or other plants.

6. A method according to claim 1, wherein said surface to be treated is a surface of a substrate comprising a building material, including concrete, motor, rendering, cement, brick, tiles, plaster, stainless steel, mild steel, or alloy materials.

7. A method according to claim 1, wherein said laser beam is produced by a laser, said laser being an ultraviolet, visible, or infrared wavelength laser.

8. A method according to claim 1, wherein said laser beam is produced by a laser, said laser being selected from a gas laser, a solid state laser, an exciter laser, a dye laser, a free electron laster, or a semiconductor laser.

9. A method according to claim 1, wherein said laser beam is pulsed or continuous.

10. A method according to claim 1, wherein said laser beam has a power density, an intensity, and a scanning speed, said power density being between 200 $W.cm^{-2}$ and 250 $W.cm^{-2}$, said intensity being between 150 $W.cm^{-2}$ and 10 $kW.cm^{-2}$, and said scanning speed being between 1 $mm.s^{-1}$ and 1,000 $mm.s^{-1}$.

11. A method of removing from a surface of an object a contaminating substance buried in an organic substance on said surface of said object, the method including:

(a) directing a laser beam at said organic substance, said laser beam causing chemical oxidation of said organic substance on said surface of said object;

(b) delivering an oxygen providing gas to said surface of said object, said gas participating in said chemical oxidation of said organic substance; and (c) removing the chemically oxidized substance from said surface of said object.

12. A method according to claim 11, wherein said gas is compressed air.

13. A method according to claim 11, wherein said chemical oxidation produces waste materials, said waste materials being removed by suction.

14. A method according to claim 11, further comprising the step of manually removing the chemically oxidized organic substance from said surface of said object.

15. A method according to claim 11, wherein the step of manually removing the chemically oxidized organic substance comprises blowing the said chemically oxidized organic substance off said surface of said object using delivered gas.

16. A method according to claim 11, wherein said contaminating substance is a radioactive, biological, or chemical contaminant.

17. A method according to claim 11, wherein said organic substance in which said contaminating substance is buried includes one or more of paint, epoxy resin, sealant, adhesive, plastics, cloth, fungus, moss, lichen, or other plants.

18. A method according to claim 11, wherein said surface to be treated is a surface of a substrate comprising a building material, including concrete, motor, rendering, cement, brick, tiles, plaster, stainless steel, mild steel, or alloy materials.

19. A method according to claim 11, wherein said laser beam is produced by a laser, said laser being an ultraviolet, visible, or infrared wavelength laser.

20. A method of removing from a surface of an object a contaminating substance buried in an organic substance on said surface of said object, the method including:

(a) directing a laser beam at said organic substance such that said organic substance is chemically oxidized on said surface of said object and said contaminating substance substantially remains on said surface after said oxidation; and (b) removing said contaminating substance from said surface in a solid state.

21. A method according to claim 20, wherein the step of directing a laser includes the organic substance being chemically oxidized into an ash that remains on said surface of said object.

22. A method for removing from a surface of an object a contaminating substance buried in an organic substance on said surface of said object, said method comprising:

(a) directing a laser beam and an oxygenated gas flow through a first nozzle and onto said organic substance, said laser beam and oxygenated gas flow chemically oxidizing the organic substance; and (b) sucking into a second nozzle said chemically oxidized organic substance and said contaminating substance on said surface of said object.

23. A method as recited in claim 22, wherein said sucking step comprises said second nozzle surrounding said first nozzle.

24. A method as recited in claim 22, wherein said step of directing a laser beam comprises passing the laser beam through a flexible beam delivery system to a hand set.

25. A method as recited in claim 22, wherein said step of directing a laser beam includes the oxygenated gas flow being compressed air.

* * * * *